Dec. 28, 1965
J. W. MILLER
AUTOMATIC GAIN CONTROL CIRCUIT
EMPLOYING VARIABLE ATTENUATION
BALANCED DIODE BRIDGE
Filed May 7, 1963
3,226,653
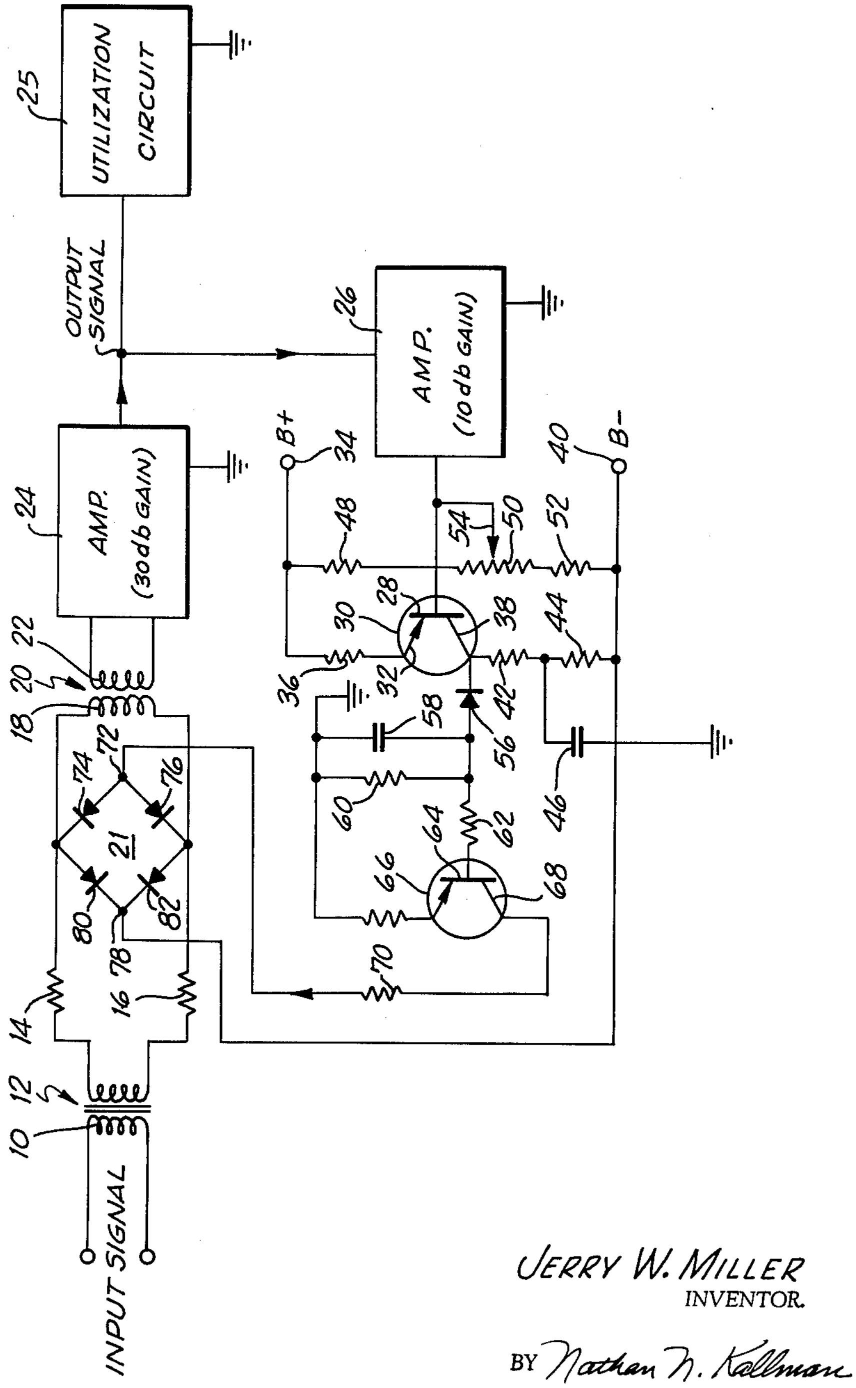
JERRY W. MILLER
INVENTOR.
BY Nathan N. Kallman
ATTORNEY 3,226,653
Patented Dec. 28, 1965

3,226,653

AUTOMATIC GAIN CONTROL CIRCUIT EMPLOYING VARIABLE ATTENUATION BALANCED DIODE BRIDGE

Jerry W. Miller, Mountain View, Calif., assignor to Ampex Corporation, Redwood City, Calif., a corporation of California Filed May 7, 1963, Ser. No. 278,674
3 Claims. (Cl. 330—26)

This invention relates to an automatic gain control circuit, and is more particularly directed to such a circuit which employs a variable attenuation balanced diode bridge in the accomplishment of automatic gain control.

Automatic gain control (AGC) action is an important factor in many signal processing systems, particularly in audio circuits, and performance varies greatly in different designs. The primary function of AGC action is to provide a nearly constant output signal level, independent of average input level, by controlling the gain of amplifier stages. AGC action generally involves monitoring the signal level to develop a D.C. voltage, that is applied to the amplifiers as a gain controlling variable bias.

Although many forms of AGC circuits are presently known, it is difficult to construct a circuit that provides a minimum of signal distortion over a large frequency range. When attempting to achieve this feature, the circuits become unduly complicated with many vacuum tubes and accessory components, thus lending to the complexity, size and weight of the circuit in addition to requiring extensive maintenance.

An object of this invention is to provide a novel and improved automatic gain control circuit.

Another object of this invention is to provide an automatic gain control circuit having a low distortion characteristic over a relatively wide frequency range.

In accordance with this invention, an automatic gain control (AGC) circuit comprises a variable attenuation network in the form of a balanced diode bridge that is controlled by a bias control transistor. Whenever the signal being processed exceeds a predetermined level, the bias control transistor provides a bias current that decreases the impedance of the bridge, which results in a corresponding reduction in the amplification or gain of the circuit. Detection means are provided to sense when the signal exceeds the desired peak level, and the normally non-conducting bias control transistor is driven into conduction in the event that the signal has an excessive amplitude. Since the diodes of the bridge exhibit a dynamic impedance that varies inversely with the applied bias current, a linear AGC action is realized.

The invention will be described in greater detail with reference to the sole figure of the drawing that is a schematic diagram, partly in block, of the inventive circuit.

In FIGURE 1, an input signal is applied to the primary winding 10 of a step-down transformer 12 that reduces the signal voltage to a low level. The stepped-down alternating signal is passed through resistances 14 and 16 to the primary winding 18 of a second transformer 20. When the input signal is within a defined range, a balanced diode bridge 21, that is connected in parallel across the resistances 14 and 16, is nonconducting and approximates a fixed shunt resistance that terminates the resistances 14 and 16. However, if the input signal exceeds a predetermined level, the diode bridge 21 becomes conducting and serves as a variable attenuator or A.C. impedance, as explained hereinafter. In any event, the signal that is transferred between the windings of the second transformer 20 is taken from the secondary winding 22, and is applied as a double-ended input signal to a high gain amplifier 24. An amplified output signal is derived from amplifier 24 for further processing by a utilization circuit 25, which may be a record amplifier for example, and concurrently the signal is also applied to another high gain amplifier 26 that is part of a feedback loop.

The feedback signal is received from the amplifier 26 and directed to the base 28 of a switch control transistor 30, which is depicted as a PNP transistor by way of example. The emitter 32 of the switch control transistor 30 is coupled to a positive voltage source 34 through a bias resistor 36, whereas the collector or output electrode 38 is coupled to a negative source of potential 40 through a load resistor 42 and resistor 44, whereby transistor 30 is normally conducting. One electrode of a bypass capacitor 46 is coupled between the resistors 42 and 44 and the other electrode is connected to a source of reference potential, such as ground. Between the voltage sources 34 and 40, there is connected a voltage divider consisting of resistors 48, 50 and 52 in series. The resistor 50 is a variable resistance or potentiometer, having a tap 54 associated therewith and in connection with the base 28 of the transistor 30, which serves to establish a threshold voltage above which emitter-collector current flows in the transistor 30. As the signal that is applied to the base 28 is increased, the current flow through the transistor 30 is increased.

When a signal having an amplitude exceeding a predetermined voltage is applied to the base 28 of switch control transistor 30, the transistor 30 is driven towards saturation. The increased current from the collector 38 forward biases a diode switch 56, the cathode of which is coupled to the collector 38, into conduction. The current is passed through the switch 56 to charge a capacitor 58, which in conjunction with the diode 56 serves as a peak detector. The peak level of the processed alternating signal is detected by the capacitor 58 which stores the signal energy. The rate of capacitor discharge is determined by a resistance 60 that forms a time constant network with the capacitor 58. The discharged signal energy is applied through a bias resistor 62 to the base 64 of a bias control transistor 66.

The normally nonconducting bias control transistor 66 is driven into conduction, and provides a bias current from its collector electrode 68 through load resistor 70 to a junction 72 between the anodes of diodes 74 and 76 of the balanced bridge 21. The bias current has a magnitude that is dependent on the peak level of the signal detected by the capacitor 58. As a result of the bias current, a potential difference is established between the junction 72 and an opposing junction 78, the latter being located between the cathodes of diodes 80 and 82 of the balanced bridge 21. The bridge 21 then conducts in accordance with the magnitude of the bias current applied to the junction 72. Thus, the dynamic impedance of the bridge 21 is decreased as the bias current increases, and the total attenuation between transformer 12 and transformer 20 is increased by the reduction of the bridge impedance that terminates the resistors 14 and 16. In this manner, the signal that passes from the output of the transformer 12 to the input winding 18 of the transformer 20 is reduced in proportion to the collector current received from the transistor 66, which in turn depends upon the signal amplitude seen by the peak detector comprising the combination of the diode 56 and the capacitor 58.

The AGC circuit, comprising a peak detector, bias control transistor and balanced bridge in a feedback loop, serves to control the gain of an amplifier with a minimum of distortion over a wide range. Since the amplifiers in the inventive circuit are characterized by high gain, any small increase in the output voltage causes relatively large changes in the current flow through the bias control transistor, with resultant large variations in signal attenuation. Therefore, a "stiff" AGC characteristic is realized. The symmetrical arrangement of the diode bridge substantially eliminates even harmonic distortion, and minimizes odd harmonic distortion. For example, when operating in a frequency range of 500 cycles to 20 kilocycles per second, and with input voltages varying from 5 millivolts to 250 millivolts peak-to-peak, the total harmonic distortion was less than 0.5 percent.

What is claimed is:

1. An automatic gain control circuit comprising:
first and second transformers each including primary and secondary windings;
means for applying an input signal to the primary winding of said first transformer;
a pair of resistors respectively coupling opposite ends of said secondary winding of said first transformer to opposite ends of said primary winding of said second transformer;
a variable attenuator including a balanced diode bridge having first and second junction points between the diodes thereof at opposite ends of a first diagonal of the bridge and third and fourth junction points between the diodes thereof at opposite ends of a second diagonal of the bridge, said first and second junction points respectively connected to the ends of said primary winding of said second transformer;
high gain amplifying means coupled to the secondary winding of the second transformer;
a switching control transistor coupled to the amplifying means, having emitter, base and collector electrodes, said emitter and collector electrodes being coupled to voltage sources;
a voltage divider coupled to the voltage sources, including a variable resistance, for biasing the base electrode of the switching control transistor;
a switching diode having an anode and a cathode, said cathode coupled to the collector electrode of the switching control transistor;
a capacitor coupled to the anode of the switching diode to provide a peak detector;
a resistance connected in parallel with said capacitor and providing a time constant network thereby controlling the discharge time of said capacitor;
a bias control transistor having emitter, base and collector electrodes, the base electrode being coupled to the time constant network, the collector electrode of the bias control transistor being coupled to said third function point between the diodes of the diode bridge; and
means for providing a potential to said fourth junction point between the diodes of the diode bridge.

2. An automatic gain control circuit comprising:
an input transformer having a primary and secondary winding;
means for applying an input signal across the primary winding;
a second transformer having primary and secondary windings;
a pair of resistances coupled between the ends of the secondary winding of said first transformer and the ends of the primary winding of said second transformer;
a balanced diode bridge having first and second junction points between the diodes thereof at opposite ends of a first diagonal of the bridge and third and fourth junction points between the diodes thereof at opposite ends of a second diagonal of the bridge, said first and second junction points respectively connected between said resistances and the primary winding of said second transformer;
a high gain amplifier coupled to the secondary winding of said second transformer;
a second amplifier for amplifying a feedback signal derived from the output circuit of said high gain amplifier;
a switching control transistor, having emitter, base and collector electrodes, said emitter and collector electrodes being coupled to voltage sources, said base electrode being coupled to the output of said second amplifier;
a voltage divider coupled to the voltage sources, including a variable resistance, for biasing the base electrode of the switching control transistor;
a switching diode having an anode and a cathode, said cathode coupled to the collector electrode of the switching control transistor;
a capacitor coupled to the anode of the switching diode to provide a peak detector;
a resistance connected in parallel with said capacitor and providing a time constant network thereby controlling the discharge time of said capacitor;
a bias control transistor having emitter, base and collector electrodes, the base electrode being coupled to the time constant network, the collector electrode being coupled to said third junction point between the diodes of the diode bridge; and
means for providing a voltage to said fourth junction point between the diodes of the diode bridge to cause said bridge to conduct when said bias control transistor provides a bias current.

3. An automatic gain control circuit for an amplifier having input and output circuits, comprising a balanced diode bridge having first and second junction points between diodes thereof at opposite ends of a first bridge diagonal and third and fourth junction points between diodes thereof at opposite ends of a second bridge diagonal, said first and second junction points connecting said bridge in parallel with said input circuit of said amplifier;
a switching control transistor having emitter, base, and collector electrodes, said emitter and collector electrodes being coupled to voltage sources;
means coupled to said voltage sources and to said base electrode of said switching control transistor for biasing same to a predetermined threshold;
means coupling said output circuit of said amplifier to said base electrode of said switching control transistor;
a switching diode having an anode and a cathode, said cathode connected to said collector electrode of said switching control transistor;
a capacitor coupled to said anode of said diode to provide a peak detector;
a resistance connected in parallel with said capacitor to provide a time constant network for controlling the discharge time of said capacitor;
a bias control transistor having emitter, base, and collector electrodes, said time constant network coupled between said base and emitter of said bias control transistor,
said collector electrode of said bias control transistor coupled to said third junction point of said bridge;
and means coupled to said fourth junction point of said bridge for supplying a voltage thereto to cause said bridge to conduct when said bias control transistor provides a bias current.

(References on following page)

References Cited by the Examiner

UNITED STATES PATENTS

| | | | |
|---|---|---|---|
| 2,952,006 | 9/1960 | McCarter | 330—145 X |
| 2,999,169 | 9/1961 | Feiner | 330—29 X |
| 3,027,518 | 3/1962 | Ketchledge | 330—29 X |
| 3,109,989 | 11/1963 | Muir | 330—29 X |
| 3,115,601 | 12/1963 | Harris. | |
| 3,117,287 | 1/1964 | Damico | 330—29 X |

FOREIGN PATENTS

| | | | |
|---|---|---|---|
| 921,347 | 3/1963 | Great Britain. | |

ROY LAKE, *Primary Examiner.*